United States Patent [19]

Hirosaki

[11] Patent Number: 4,893,265
[45] Date of Patent: Jan. 9, 1990

[54] RATE CONVERSION DIGITAL FILTER
[75] Inventor: Botaro Hirosaki, Tokyo, Japan
[73] Assignee: NEC Corporation, Tokyo, Japan
[21] Appl. No.: 795,147
[22] Filed: Nov. 5, 1985
[30] Foreign Application Priority Data Nov. 8, 1984 [JP] Japan ................................ 59-235409

[51] Int. Cl.⁴ .............................................. G06F 15/31
[52] U.S. Cl. ............................ 364/724.10; 364/724.13
[58] Field of Search ............... 364/724, 724.01, 724.10, 364/724.13

[56] References Cited

U.S. PATENT DOCUMENTS

| | | | |
|---|---|---|---|
| 3,370,292 | 2/1968 | Deerfield | 364/724 |
| 3,629,509 | 12/1971 | Glaser | 364/724 |
| 3,665,171 | 5/1972 | Morrow | 364/724 |
| 3,676,654 | 7/1972 | Melvin | 364/724 |
| 4,322,810 | 3/1982 | Nakayama | 364/724 |
| 4,606,009 | 8/1986 | Wiesmann | 364/724 |
| 4,658,368 | 4/1987 | Blais | 364/724 |
| 4,700,345 | 10/1987 | Morcom et al. | 364/724 |

OTHER PUBLICATIONS

Kohavi, *Switching and Finite Automata Theory*, 1978, McGraw-Hill, Inc., Section 15-2, pp. 560–562.

Primary Examiner—Gary V. Harkcom
Assistant Examiner—Long T. Nguyen
Attorney, Agent, or Firm—Sughrue, Mion, Zinn, Macpeak & Seas

[57] ABSTRACT

A finite impulse response digital filter includes a first selector for alternately selecting samples of first and second data streams at intervals T, a second selector for alternately selecting samples of the first and second data streams at intervals T in a manner complementary to the first selector. First and second subfilters are clocked at frequency 1/T and respectively responsive to the outputs of the first and second selectors. The subfilters comprise a common register network for introducing different incremental delay times to the outputs of the first and second selectors and supply the delayed signals to a demultiplexer.

4 Claims, 3 Drawing Sheets

RATE CONVERSION DIGITAL FILTER

BACKGROUND OF THE INVENTION

The present invention relates to a rate conversion digital filter in which the sampling rate of the input digital signal is reduced by a factor of ½. The present invention is particularly useful for digital recording of two-channel signals.

Sampling rate reduction techniques are used for interfacing different types of digital communications media which proliferate at an increasing rate in various fields of application. In digital audio techniques, for example, original analog signals are sampled at a predetermined sampling frequency fs and quantized into a digital stream of 16-bit words. If the original signal has a bandwidth exceeding the fs/2 limit, foldover distortion, or "aliasing" occurs. For this purpose the analog signal is passed through an analog low-pass filter having a cut-off frequency of fs/2 before it is sampled. Since audio recording requires a distortion factor as high as 70 to 80 dB, the roll-off characteristic of the filter must be as sharp as possible and group delays resulting from such filter characteristic must be equalized.

SUMMARY OF THE INVENTION

It is therefore an object of the invention to provide a rate conversion digital filter having a simplified structure.

According to the present invention, a finite impulse response digital filter is adapted to be responsive to first and second digital data streams each being sampled at a frequency 1/T. The digital filter comprises a first selector for alternately selecting samples of the first and second data streams at intervals T, a second selector for alternately selecting samples of the first and second data streams at intervals T in a manner complementary to the first selector, and first and second subfilters clocked at the frequency 1/T and responsive to the outputs of the first and second selectors respectively. The subfilters comprise a common register network for introducing different incremental delay times to the outputs of the first and second selectors. A demultiplexer is connected to the output of the register network.

Preferably, the first and second subfilters comprise a common register-adder network including a series of N registers arranged in stages, each register being clocked at frequency 1/T to introduce a delay time T and a series of N adders arranged in stages in association respectively with the N registers for summing the outputs of the associated registers and the outputs of the multipliers of the first and second groups. The adders of the first to (N−1)th stages supply the results of the summation to the registers of the second to Nth stages. The register of the first stage is responsive to the output of a multiplier of one of the first and second groups, the multipliers of the first group being connected to alternate ones of the adders and the multipliers of the second group being connected to the remainder of the adders, the output of the adder of the Nth stage being supplied to the demultiplexer.

BRIEF DESCRIPTION OF THE DRAWINGS

The present invention will be described in further detail with reference to the accompanying drawings, in which.

DETAILED DESCRIPTION

Figure 1:
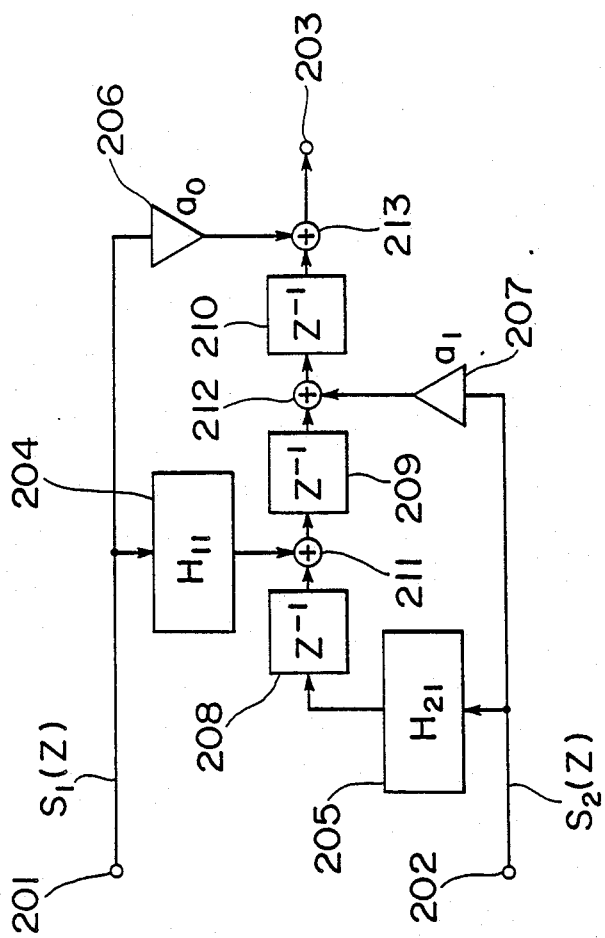
FIG. 1 is a block diagram useful for describing the underlying principle of the present invention.

Before going into detail of the present invention, the underlying principle of the present invention will first be described. Assume that the sampling frequency of the input digital data sftream is 1/T and $\exp\{-j\omega T\}$ is represented by Z according to the Z-conversio notation so that two input digital streams are represented by $X_1(z)$ and $X_2(z)$, respectively, rate reduction operation can be achieved by passing $X_1(z)$ and $X_2(z)$ respectively through digital filters $H(z)$ having a cut-off frequency ¼T and sampling every other digital samples from each of the outputs of the digital filters. Let $[A(z)]_E$ and $[A(z)]_O$ represent respectively the processes involved in sampling the even-numbered samples and the odd-numbered samples of a digital data stream $A(z)$, the output data stream $Y(z)$ which is obtained by multiplexing the two rate-reduced data streams is given by:

$$Y(z) = [X_1(z)H(z)]_E + [X_2(z)H(z)]_O \quad (1)$$

If the digital filter $H(z)$ is a finite impulse response (FIR) digital filter of the $N(-1)$th order, and if $H(z)$ is reduced as follows:

$$H(z) = a_0 + a_1 z^{-1} + a_2 z^{-2} + \ldots + a_{N-1} z^{-(N-1)} \quad (2)$$

$H(z)$ can be divided into the following two sublifters:

$$H(z) = H_1(z^2) + z^{-1} H_2(z^2) \quad (3)$$

where, $$H_1(z^2) = a_0 + a_2 z^{-2} + \ldots + a_{N-2} z^{-(N-2)} \quad (4)$$

$$H_2(z^2) = a_1 + a_3 z^{-2} + \ldots + a_{N-1} z^{-(N-2)} \quad (5)$$

From Equations 1 and 3, the multiplexed output $Y(z)$ is given by:

$$Y(z) = ([X_1(z)]_E + [X_2(z)]_O)H_1(z^2) + ([X_2(z)]_E + [X_1(z)]_O)z^{-1}H_2(z^2) \quad (6)$$

If $H_1(z^2)$ and $H_2(z^2)$ given by Equations 4 and 5 are represented respectively by:

$$H_1(z^2) = a_0 + z^{-2} H_{11}(z^2)$$

$$H_2(z^2) = a_1 + z^{-2} H_{21}(z^2)$$

then Equation 6 can be rewritten as:

$$\begin{aligned} Y(z) &= S_1(z)[a_0 + z^{-2} H_{11}(z^2)] + \\ &\quad S_2(z) z^{-1}[a_1 + z^{-2} H_{21}(z^2)] \\ &= S_1(z) a_0 + S_1(z) z^{-2} H_{11}(z^2) + \\ &\quad S_2(z) z^{-1} a_1 + S_2(z) z^{-3} H_{21}(z^2) \end{aligned} \quad (7)$$

where, $$S_1(z) = [X_1(z)]_E + [X_2(z)]_O$$

$$S_2(z) = [X_2(z)]_E + [X_1(z)]_O$$

Figure 2:
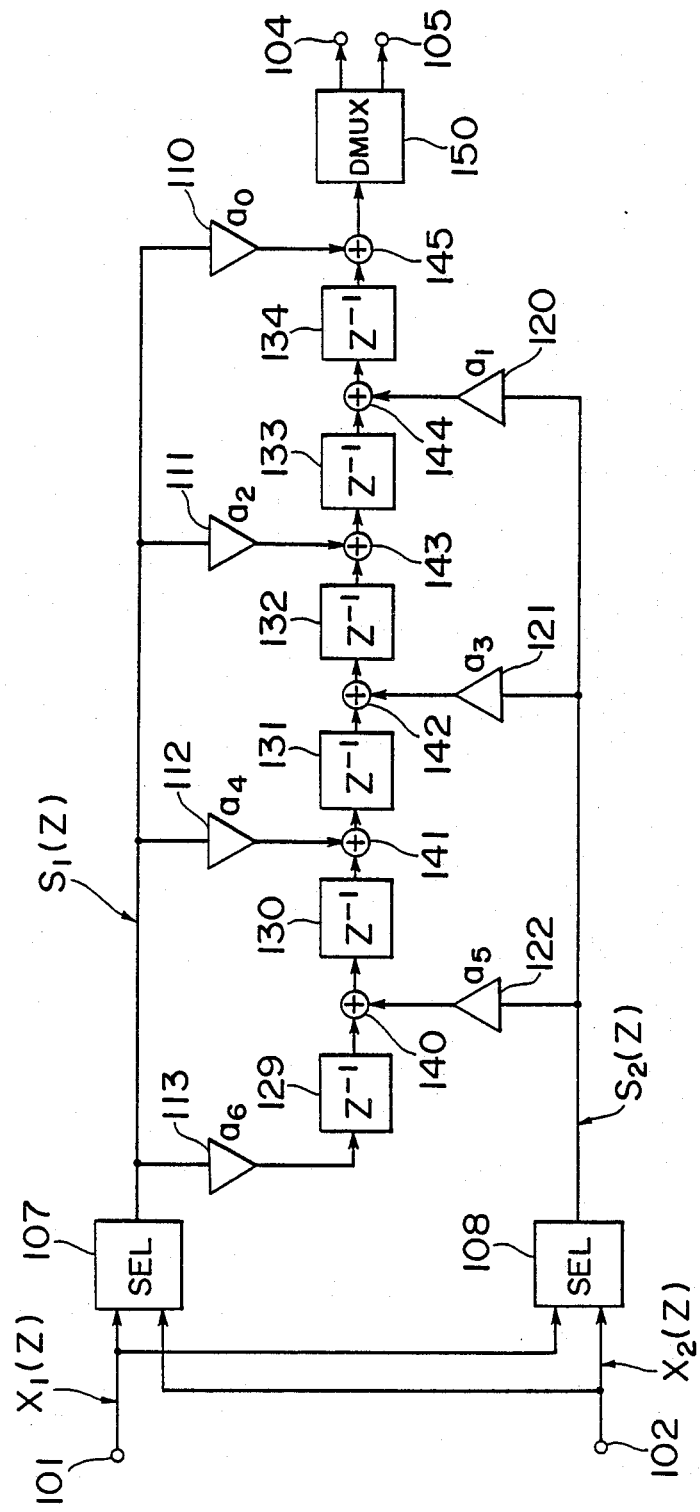
FIG. 2 is a block diagram of a specific embodiment of a sampling rate reduction digital filter constructed according to the present invention.

Equation 7 can be realized by a block-diagram shown in FIG. 1. A digital input signal $S_1(z)$ is applied through a terminal 201 to a digital filter 204 having a filter function $H_{11}(z^2)$ and to a multiplier 206 having a multiplying factor $a_0$ and a digital input signal $S_2(z)$ is applied through a terminal 202 to a digital filter 205 having a filter function $H_{21}(z^2)$ and to a multiplier 207 having a multiplying factor $a_1$. Indicated at 208, 209 and 210 are registers each having a unit delay time T. The output of filter 205 is delayed by shift register 208 and summed with the output of filter 204 in an adder 211. The output of adder 211 is delayed by shift register 209 and summed with the output of multiplier 207 in an adder 212. The output of adder 212 is delayed by shift register 210 and summed with the output of multiplier 206 and supplied to an output terminal 203. By expanding the digital filter functions $H_{11}(z^2)$ and $H_{21}(z^2)$, a specific embodiment of the rate conversion digital filter can be realized as shown in FIG. 2.

For purposes of simplicity, a digital filter of the sixth order (N=7) is illustrated. In FIG. 2, first and second data streams of digital samples $X_1(z)$ and $X_2(z)$ having a sampling frequency 1/T are applied to input terminals 101 and 102, respectively. A first multiplexer, or selector multiplexes the even-numbered digital samples of the first sample series $X_1(z)$ and the odd-numbered digital samples of the second sample series $X_2(z)$ and supplies a multiplexed digital sample series $S_1(z)$ to multipliers 110, 111, 112 and 113 having multiplying factors $a_0$, $a_2$, $a_4$ and $a_6$, respectively. A second selector 108 multiplexes the odd-numbered digital samples of the first sample series $X_1(z)$ and the even-numbered digital samples of the second sample series $X_2(z)$ in a complementary manner to the selector 107 and supplies a multiplexed digital sample series $S_2(z)$ to multipliers 120, 121 and 122 having multiplying factors $a_1$, $a_3$ and $a_5$, respectively. Shift registers 129-134 are provided each being clocked at frequency 1/T to introduce a unit delay time T. The output of each register is connected to each one of adders 140-145 and the output of each of adders 140-144 is connected to the input of register of the following stage.

The rate conversion digital filter of the invention is thus formed by first and second subfilters which are respectively responsive to the outputs of the selectors 107 and 108. Shift registers 129-134 and adders 140-145 form a register-and-adder network shared in common by the first and second subfilters through the respective multipliers. The shared use of the common register-adder network results in a simplified rate conversion digital filter.

In operation, a digital sample $S_1(z)$ from selector 107 is multiplied by $a_6$ by multiplier 113 and delayed by an interval T by register 129 and multiplexed with a digital sample $S_2(z)a_5$ from multiplier 122 by adder 140 and further delayed by interval T by register 130 and multiplexed by adder 141 with a digital sample $S_1(z)a_4$ from multiplier 112. The output of adder 141 is delayed by register 131 and multiplexed by adder 142 with a digital sample $S_2(z)a_3$ from multiplier 121. The output of adder 142 is delayed by register 132, multiplexed with a sample $S_1(z)a_2$ from multiplier 111, delayed further by register 133, multiplexed by adder 144 with a digital sample $S_1(z)a_1$ from multiplier 120, delayed by register 134 and multiplexed by adder 145 with a digital sample $S_1(z)a_0$ from multiplier 110. The output of adder 145 is a series of digital samples represented by $S_1(z)a_0 + z^{-1}S_2(z)a_1 + z^{-2}S_1(z)a_2 + z^{-3}S_2(z)a_3 + z^{-4}S_1(z)a_4 + z^{-5}S_2(z)a_5 + z^{-6}S_1(z)a_6$. A demultiplexer 150 extracts samples $X_1(z)$ from the output series at twice the sampling interval T and supplies a series of even-numbered samples $[X_1(z)Hz]_E$ to an output terminal 104 and extracts samples $X_2(z)$ at twice the sampling interval T and supplies a series of odd-numbered samples $[X_2(z)Hz]_O$ to an output terimal 105.

Figure 3:
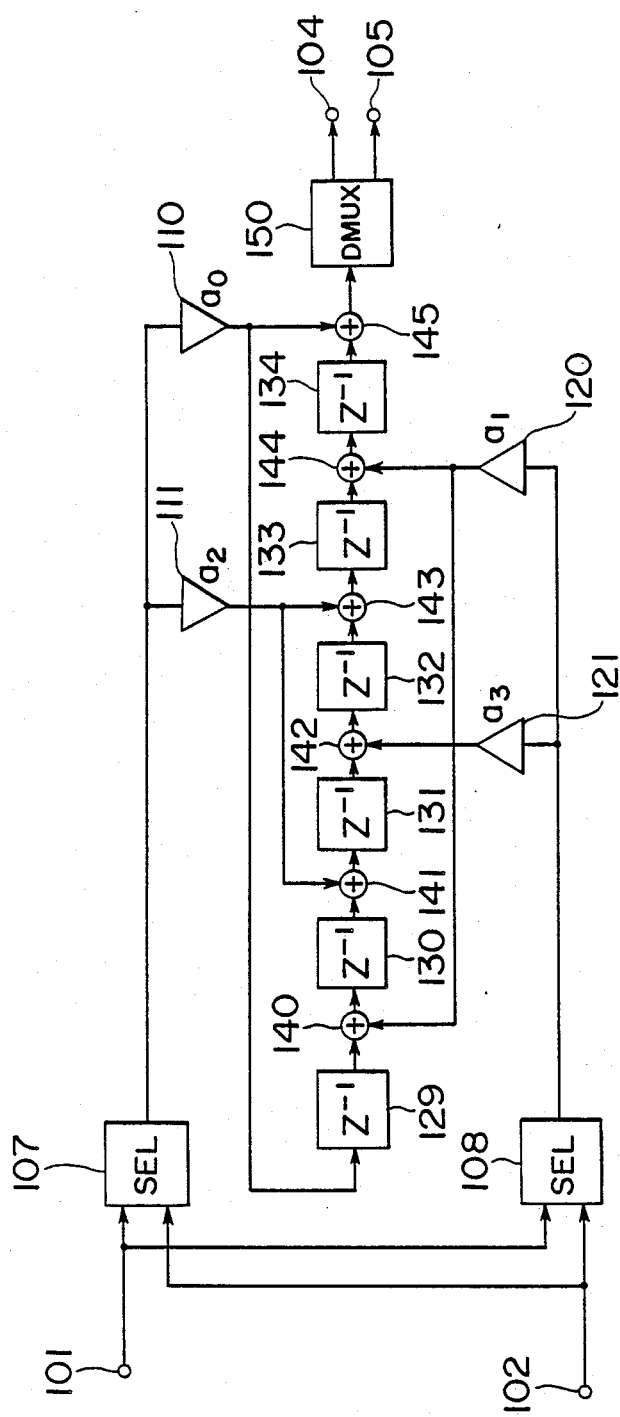
FIG. 3 is a block diagram of a simplified version of the embodiment of FIG. 1 in the case of the presence of symmetricity between coefficients.

If the sublifters have a linear relation between phase and frequency, a digital filter having no delay distortion can be realized. Such digital filters can be realized if the filter order is even since it can be shown that each of the sublifters $H_1$ and $H_2$ of Equation 3 has symmetrical coefficients. Under such conditions, relations $a_0 = a_6$, $a_2 = a_4$, $a_1 = a_5$ hold and multipliers 112, 113 and 122 can advantageously be dispensed with as shown in FIG. 3. In FIG. 3, the adders 140 and 141 take their inputs from the outputs of multipliers 120 and 111, respectively, and register 129 takes its input from the output of multiplier 110.

What is claimed is:

1. A finite impulse response digital filter responsive to first and second digital data streams each being sampled at intervals T, comprising:

a first multiplexer for alternately selecting samples of said first and second data streams at intervals t:

a second multiplexer for alternately selecting samples of said first and second data streams at intervals T in a manner complementary to said first multiplexer;

a plurality of storage means arranged in successive stages comprising at least first and last stages, and being simultaneously clocked at intervals T for introducing a unit delay time T in each of said storage means;

first multiplier means having a first plurality of ordered output terminals, comprising at least a first output terminal, for multiplying an output of said first multiplexer by first multiplying factors and generating at said first plurality of output terminals a plurality of first multiplied samples, said first ordered output terminal being connected to the first stage of said storage means;

second multiplier means having a second plurality of ordered output terminals, comprising at least a first output terminal, for multiplying an output of said second multiplexer by second multiplying factors and generating at said second plurality of output terminals a plurality of second multiplied samples; and a plurality of summation means each having first and second input terminals and an output terminal, the first input terminals and the output terminals of all but one of said plural summation means being respectively connected between successive ones of said storage means, said one summation means being connected to an output terminal of said last storage stage and said output terminal of said one summation means being a filter output terminal, first alternate ones of said second input terminals of said summation means being connected to output terminals of said first multiplier means and second alternate ones of said second input terminals of said summation means being connected to output terminals of said second multiplier means for providing summation of said first multiplied samples respectively with outputs of alternate ones of said storage means, and providing summation of said second multiplied samples respectively with outputs of the other storage means, whereby a summation of multiplied samples of each of said first and second data streams alternately appears at intervals 2T at said filter output terminal.

2. A finite impulse response digital filter as claims in claim 1, further comprising a demultiplexer for separating said summation of multiplied samples of each digital data streams from the summation of multiplied samples of the other data streams.

3. A finite impulse response digital filter as claimed in claim 2, wherein said storage means are provided as many as N staages and said summation means are provided as many as N stages, said N storage means being interconnected by the first to (N−1)th stages of said summation means, the N-th stage storage means being connected by the N-th stage summation means to said demultiplexer, a first one of said first multiplied samples being supplied to the first stage of said storage means and the others of said first multiplied samples being respectively supplied to even number stages of said summation means, and said second multiplied samples being respectively supplied to odd number stages of said summation means.

4. A finite impulse response filter as claimed in claim 1, wherein each of said first and second multiplier means comprises an equal number of multipliers, a total number of said multipliers of said first and second multiplier means being smaller than a total number of said storage means, each output of the multipliers of said first multiplier means being connected to one or more of the alternate ones of said summation means and each output of the multipliers of said second multiplier means being connected to one or more of the others of said summation means so that an odd number of said first and second multiplying factors are provided for establishing a symmetrical value relationship with respect to one of said first and second multiplying factors.

* * * * *